United States Patent [19]

Hirayama

[11] Patent Number: 5,315,551
[45] Date of Patent: May 24, 1994

[54] SEMICONDUCTOR MEMORY DEVICE WITH PRECHARGING VOLTAGE LEVEL UNCHANGED BY DEFECTIVE MEMORY CELL

[75] Inventor: Kazutoshi Hirayama, Hyogo, Japan

[73] Assignee: Mitsubishi Denki Kabushiki Kaisha, Tokyo, Japan

[21] Appl. No.: 651,855

[22] Filed: Feb. 7, 1991

[30] Foreign Application Priority Data

Feb. 21, 1990 [JP] Japan .................................. 2-41563

[51] Int. Cl.⁵ .............................................. G11C 29/00
[52] U.S. Cl. ...................................... 365/200; 365/203; 365/225.7; 307/219
[58] Field of Search ............... 365/203, 200, 225.7; 307/219

[56] References Cited

U.S. PATENT DOCUMENTS

| | | | |
|---|---|---|---|
| 4,451,907 | 5/1984 | Donoghue et al. | 365/203 |
| 4,639,895 | 1/1987 | Iwahashi et al. | 365/200 |
| 4,654,830 | 3/1987 | Chua et al. | 365/200 |
| 4,769,791 | 9/1988 | Liou et al. | 365/203 |
| 4,914,632 | 4/1990 | Fujishima et al. | 365/200 |
| 4,985,866 | 1/1991 | Nakaizumi | 365/200 |
| 5,097,448 | 3/1992 | Segawa | 365/200 |
| 5,134,584 | 7/1992 | Boler et al. | 365/200 |
| 5,146,429 | 9/1992 | Kawai et al. | 365/200 |

FOREIGN PATENT DOCUMENTS

| | | |
|---|---|---|
| 0121394 | 10/1984 | European Pat. Off. |
| 58-137193 | 8/1983 | Japan |
| 90/12401 | 10/1990 | World Int. Prop. O. .......... 365/200 |

OTHER PUBLICATIONS

Haraszti, "Associative Control For Fault-Tolerant CMOS/SOS RAM-S", Sep. 22-24, 1981, pp. 194-198.
IEEE Journal of Solid-State Circuits, "A 256K Dynamic RAM with Page-Nibble Mode", vol. sc-18, No. 5, Oct. 1983, pp. 470-477.

*Primary Examiner*—William L. Sikes
*Assistant Examiner*—Terry D. Cunningham
*Attorney, Agent, or Firm*—Lowe, Price, LeBlanc & Becker

[57] ABSTRACT

A semiconductor memory device having a redundant circuit for electrically replacing a defective memory cell column with a spare memory cell column. An electric fuse (25) is connected between a precharging voltage line ($V_{BL}$) and bit lines (BL, $\overline{BL}$). When a defective memory cell exists, the precharging voltage tries to vary through this fuse. However, this fuse is cut off, so that the precharging voltage is prevented from varying. Accordingly, data stored in the remaining memory cells are read out correctly and without delay.

8 Claims, 11 Drawing Sheets

SHORT-CIRCUIT

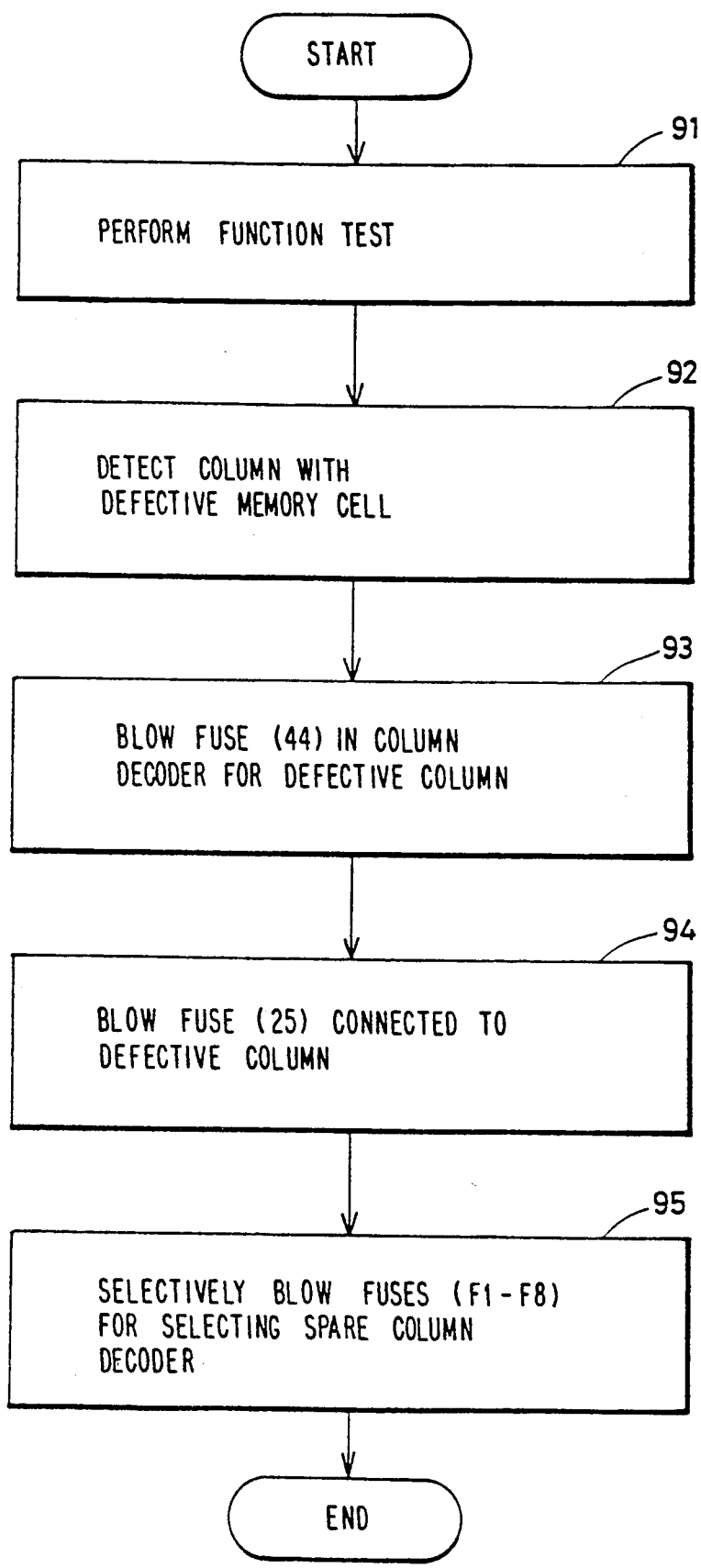

SEMICONDUCTOR MEMORY DEVICE WITH PRECHARGING VOLTAGE LEVEL UNCHANGED BY DEFECTIVE MEMORY CELL

BACKGROUND OF THE INVENTION

1. Field of the Invention

The present invention generally relates to a semiconductor memory device, and particularly, to a semiconductor memory device having a redundant circuit function for electrically replacing a defective memory cell column including a defective memory cell with a spare memory cell column. The present invention has particular applicability to a dynamic random access memory device.

2. Description of the Background Art

As a semiconductor memory device is highly integrated, a defect in a memory cell is occurring increasingly. As a cause of a defect, bad conditions in the manufacturing process are mainly pointed out. For example, it is assumed that a defect occurred only in one memory cell in a semiconductor memory device having 1 megabit of memory capacity. If no measure is taken against that, that memory device has to be considered an inferior product even when there are no defects in the remaining memory cells. This means that the manufacturing efficiency, or the yield is degraded. A method of providing a redundant circuit in a memory device is known for improving the degraded yield. When a redundant circuit is provided in a memory device, for example, a defective memory cell column including a defective memory cell is electrically replaced with another spare memory cell column. For the electrical replacement, a spare memory cell column, a spare word line, a spare decoder or the like are prepared in the memory device in advance.

Some inspections before delivery are performed about a semiconductor memory device to find out the existence of a defective memory cell. When a defective memory cell is detected by the inspection, the defective memory cell column including the defective memory cell is electrically replaced with a spare memory cell column. To implement the replacement, a certain appropriate fuse is cut off among fuses previously prepared in the semiconductor memory device. Known methods for cutting a fuse off include a method utilizing a laser trimmer device cutting a fuse off by employing laser beam, and a method of melting a fuse down by providing large current to the fuse.

FIG. 1 is a block diagram of a conventional dynamic random access memory (hereinafter, referred to as "DRAM"). Referring to FIG. 1, the DRAM includes a memory cell array 4 having memory cells provided in rows and columns, a row decoder 3 for activating word lines for selecting memory cell rows, and a column decoder and a sense amplifier 5 for selecting memory cell columns and amplifying the read data signal. It is pointed out that this DRAM includes spare memory cell columns provided in an edge portion of the memory cell array 4.

FIG. 2A is a circuit diagram of the memory cell array 4 shown in FIG. 1. Referring to FIG. 2A, memory cells MC are connected to respective bit lines BL and $\overline{BL}$. A sense amplifier 50 is connected between the bit lines BL and $\overline{BL}$. The sense amplifier 50 is activated by turning on a NMOS transistor 11 and a PMOS transistor 12. NMOS transistors 15 and 16 are connected between the bit line pair BL, $\overline{BL}$ and an I/O line pair 23. The transistors 15 and 16 operate in response to an output signal of a column decoder 40. Switching transistors provided in the respective memory cells MC operate in response to output signals of a row decoder 3.

The column decoder 40 operates in response to column address signals CAi, $\overline{CAi}$, CAj, $\overline{CAk}$, $\overline{CAm}$ and $\overline{CAn}$. When a predetermined column address signal is provided, all of the transistors 46 turn off, and all of the transistors 45 turn on. Accordingly, a node 43 is brought to ground potential through a fuse 44. As a result, NOR gates 41 or 42 generates high level signal Y1 or Y2 for a selecting memory cell column. The fuse 44 for disabling the column decoder 40 is provided in the column decoder 40. On the other hand, when the above-described predetermined column address signal is not provided, or when the fuse 44 is cut off, the node 43 becomes high level. Accordingly, the NOR gates 41 and 42 generate low level signals Y1 and Y2.

A precharging voltage generating circuit 6 is provided for precharging bit lines. The precharging voltage $V_{BL}$ is provided to bit line pairs through NMOS transistors 13 and 14 connected to the bit lines BL and $\overline{BL}$. The transistors 13 and 14 operate in response to an equalizing signal EQ generated from a signal generator 70.

FIG. 2B is a circuit diagram of the spare memory cell column 4s shown in FIG. 1. Referring to FIG. 2B, the spare memory cell column 4s has a circuit configuration same as that of a common memory cell column shown in FIG. 2A. The spare column decoder 40s also has a circuit configuration almost same as that of the common column decoder 40 shown in FIG. 2A. The spare column decoder 40s, however, receives spare column signals $\overline{CAjs}$, $\overline{CAks}$, $\overline{CAms}$ and $\overline{CAns}$ generated by the program circuit 8 shown in FIG. 2C.

Referring to FIG. 2C, program circuit 8 includes fuses F1 through F8 for programming selection of spare memory cell columns. Each Fuse F1 through F8 is connected to receive column address signals CAj, $\overline{CAj}$ through CAn and $\overline{CAn}$ through each inverter correspondingly provided. The column address signals CAj and $\overline{CAj}$ through CAn and $\overline{CAn}$ have low level potential in a stand by state. For example, if a defective memory cell or cells exist(s) on the column specified with a column address signal (CAj, CAk, CAm, CAn)=(1, 0, 0, 0), fuses F2, F3, F5 and F7 are blown. Accordingly, when a column address signal for selecting a defective memory column is provided, high level signals $\overline{CAjs}$, $\overline{CAks}$, $\overline{CAms}$ and $\overline{CAns}$ are supplied as outputs. As a result, in the spare column decoder 40s shown in FIG. 2B, a spare column enable signal $\overline{SCE}$ attains a low level, so that the spare money cell column 4s is selected in response to column address signals CAi and $\overline{CAi}$. In other words, when a programed defective memory cell column is addressed, spare memory cell column 4s is accessed instead.

FIG. 2D is a circuit diagram of the $V_{BL}$ generating circuit 6 shown in FIG. 2A. Referring to FIG. 2D, the $V_{BL}$ generating circuit 6 includes resistors R1 and R2 connected in series between the power source Vcc and ground. With voltage division of resistors R1 and R2, a precharge voltage $V_{BL}$ having a value of Vcc/2 is generated.

FIG. 2E is a circuit diagram of the row decoder 3 and the signal generator 70 shown in FIG. 2A and address buffer 9. Referring to FIG. 2E, the signal generator 70 generates an equalizing signal EQ and sense amplifier activating signals Sn and $\overline{\text{Sp}}$ in response to an external $\overline{\text{RAS}}$ signal. In addition, the signal generator 70 generates a row address buffer enable signal RABE and a word line driving signal $\phi x$ obtained by delaying an external $\overline{\text{RAS}}$ signal. Address buffer 9 receives external address signals ext. Add. Address buffer 9 generates internal address signals int.Add and int.$\overline{\text{Add}}$ in response to a signal RABE generated by signal generator 70. Row decoder 3 receives a high level word line driving signal $\phi x$, and activates the specified word line WL in response to internal address signals int.$\overline{\text{Add}}$ and int.Add.

FIG. 3 is a timing chart for showing the operation of the DRAM shown in FIG. 2A. Referring to FIGS. 2A and 3, the operation of the DRAM will be described below. As a high level equalizing signal EQ is provided first, the transistors 13 and 14 are on. Thus, the bit line pair BL and $\overline{\text{BL}}$ is brought to the precharging voltage $V_{BL}$. Next, after a row address strobe signal $\overline{\text{RAS}}$ falls, the signal EQ also falls. As the transistors 13 and 14 turn off in response to the signal EQ, the bit line pair BL and $\overline{\text{BL}}$ is brought into a floating state. Almost simultaneously with falling of the signal EQ, the voltage of the word line WL is raised by the row decoder 3. Accordingly, a small potential difference is produced between the bit lines BL and $\overline{\text{BL}}$. As the signal generator 70 raises a sense amplifier activating signal Sn and makes a signal Sp fall, the sense amplifier 50 is activated. The small potential difference produced in the bit pair is amplified by the sense amplifier 50. A high level signal Y1 is provided from the column decoder 40 thereafter and the voltage amplified by the sense amplifier 50 is provided to the I/O line pair 23. The voltage provided to this I/O line pair 23 is provided outside as a data signal read from the memory cell.

Referring to FIG. 2A again, it is noted that the column decoder 40 selects two bit line pairs in response to the column address signal. That is, when the NOR gate 41 provides a high level signal Y1, upper two bit line pairs are selected. When the NOR gate 42 provides a high level signal Y2, lower two bit line pairs are selected. However, when a defect occurs in a memory cell MC connected to any of these four bit line pairs, none of the four bit line pairs is selected by the column decoder 40. That is, as the fuse 44 provided in the column decoder 40 is disconnected, the node 43 is brought to a high level. Accordingly, the respective NOR gates 41 and 42 provide low level signals Y1 and Y2, respectively. As a result, the transistors 15 through 22 turn off, and the amplified voltage of bit line pairs is not provided to the I/O line pairs 23 and 24. Consequently, the memory cell column including a defective memory cell can not be accessed. Instead of accessing these four bit line pairs, four spare bit line pairs prepared separately are accessed.

FIG. 4 is a circuit diagram for illustrating the occurrence of a defect in a memory cell MC1. As an example of a defect, the case where the word line WL1 and a bit line BL are electrically connected by a foreign material. The foreign material may be dust in the manufacturing environment of a semiconductor memory device or a residual in the etching process. Consequently, the word line WL1 and the bit line $\overline{\text{BL}}$ are connected by a resistance component 29.

When the memory cell MC1 is not selected, the row decoder 3 provides a low level signal to the word line WL1. That is to say, a transistor 32 for driving the word line WL1 turns on in response to the signal S1, and the word line WL1 is brought to a low level. The resistance component 29 is connected between the word line WL1 and the bit line $\overline{\text{BL}}$, so that the potential of the bit line $\overline{\text{BL}}$ is gradually decreased. In other words, the potential of the bit line $\overline{\text{BL}}$ is connected to ground through the word line WL1 and the transistor 32. This causes such problems as described below.

FIG. 5 is a timing chart for illustrating abnormal reading operation caused by a memory cell defect. When a defect as shown in FIG. 4 exists in a memory cell, a read error as described below occurs. That is to say, the bit line $\overline{\text{BL}}$ is connected to ground through the resistance component 29, the word line WL1 and the transistor 32 as shown in FIG. 4, so that the precharging voltage $V_{BL}$ for the bit lines is gradually decreased as shown by the arrow P in FIG. 5. Especially, when a stand-by period is long, the decrease is considerable. With the decrease of the precharging voltage $V_{BL}$, the potential of the equalized bit line pair BL and $\overline{\text{BL}}$ is also decreased. As a result, when a small voltage difference produced in the bit line pair BL and $\overline{\text{BL}}$ is amplified by the sense amplifier, it takes longer to raise the potential of the bit line $\overline{\text{BL}}$. This means that it takes the sense amplifier a longer time to read data. That is, as shown in FIG. 5, after the sense amplifier is activated by the signals Sn and Sp (time t0), it takes a long time T until the voltage difference of the bit line pair BL and $\overline{\text{BL}}$ reaches a predetermined level (time t2). Therefore, when the column decoder 40 shown in FIG. 2 provides a high level signal Y1 (time t1), a sufficient voltage difference ($\Delta V$ in the FIGURE) is not obtained between the bit lines BL and $\overline{\text{BL}}$. Consequently, a read error caused by the presence of a defective memory cell has been produced in a conventional semiconductor memory device.

If the word line WL1 and the bit line $\overline{\text{BL}}$ shown in FIG. 4 are shorted, the $V_{BL}$ varies as shown by the chain line in FIG. 5. Accordingly, especially in this case, after activating the sense amplifier, the bit line $\overline{\text{BL}}$ takes a longer time to rise up. As a result, reading errors are caused. It is also pointed out that a state equivalent to that of short is caused when a stand by period of the DRAM is long even if short as described above is not produced.

Referring to FIG. 6, one memory cell MC includes a switching NMOS transistor Qs and a storage capacitor Cs. A cell plate voltage Vcp is supplied to one electrode of the capacitor Cs. The stored data signal is supplied to the other electrode of the capacitor Cs, and the other electrode is provided with a voltage Vce. When the stored data is "1", Vce=Vcc, and on the other hand, if the stored data is "0", Vce=0.

With a load capacitance of the bit line BL as CB, a capacitance value of the storage capacitor as CS, and a voltage of the bit line BL after activation of the word line WL as Vaft, the relationship expressed as follows holds.

$$C_B \cdot V_{BL} + Cs\,(Vce - Vcp) = C_B \cdot Vaft + Cs\,(Vaft - Vcp) \quad (1)$$

Accordingly, $$Vaft = \{1/(C_B + Cs)\} \cdot (C_B \cdot V_{BL} + Cs \cdot Vce) \quad (2)$$

When the data "1" is stored in a memory cell MC, the voltage difference $\Delta V_H$ produced on the bit line BL upon turning-on of transistor Qs is expressed as follows.

$$\Delta V_H = Vaft - V_{BL} = \{1/(1 + C_B/Cs)\} \cdot (Vce - V_{BL}) \quad (3)$$

Since the data "1" is stored, Vce≈Vcc. Accordingly, when the $V_{BL}$ is at a higher level due to some trouble, sufficient $\Delta V_H$ is not obtained. As a result, reading errors are produced.

On the other hand, when the data "0" is stored in memory cell MC, the voltage difference $\Delta V_L$ produced on the bit line BL upon turning-on of the transistor Qs is expressed as follows.

$$\Delta V_L = V_{BL} - Vaft = \{1/(1 + C_B/C_S)\} \cdot (V_{BL} - Vce) \quad (4)$$

Since the data "0" is stored, Vce≈0. Accordingly, when $V_{BL}$ is at a lower level due to such a trouble as shown in FIG. 4, sufficient $\Delta V_L$ is not obtained. As a result, reading errors are produced.

Referring to FIG. 7, the time length $t_{RP}$ of the off time period, or a stand by period of the DRAM is defined by rise and fall times of the signal $\overline{RAS}$. It is pointed out that, as the time length $t_{RP}$ is longer, or the stand by period of DRAM is longer, the voltage $V_{BL}$ of the bit line BL is reduced due to such troubles as shown in FIG. 4. Accordingly, as shown in FIG. 8, reading errors are increased as a function of the time length $t_{RP}$.

SUMMARY OF THE INVENTION

One object of the invention is to prevent a read error caused by a defective memory cell in a semiconductor memory device.

Another object is to reduce a time period required for reading in a semiconductor memory device.

Another object is to prevent the precharge voltage for bit lines from changing because of the presence of a defective memory cell in a semiconductor memory device.

Briefly stated, a semiconductor memory device according to the present invention includes a plurality of bit lines respectively connected to memory cells, a precharging voltage generating circuit for precharging the bit lines, and electric fuses connected between the precharging voltage generating circuit and the plurality of bit lines.

In operation, when a memory cell connected to a bit line has a defect, the electric fuse connected to the bit line is selectively cut off. Accordingly, the voltage produced by the precharging voltage generating circuit is prevented from varying because of the presence of the defective memory cell. As a result, the data stored in the remaining memory cells are correctly read out.

In another aspect, the semiconductor memory device according to the present invention includes a plurality of bit lines connected to memory cells, respectively, an access circuit for accessing the memory cells through the bit lines in response to an address signal, a disabling circuit for disabling the access circuit when at least one memory cell connected to a bit lines has a defect, a precharging voltage generating circuit for precharging bit lines, and a electric fuse connected between the precharging voltage generating circuit and the bit line.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a flow chart for replacing a defective memory cell column by a spare memory cell column in the DRAM shown in FIG. 9.

DESCRIPTION OF THE PREFERRED EMBODIMENTS

Figure 1:
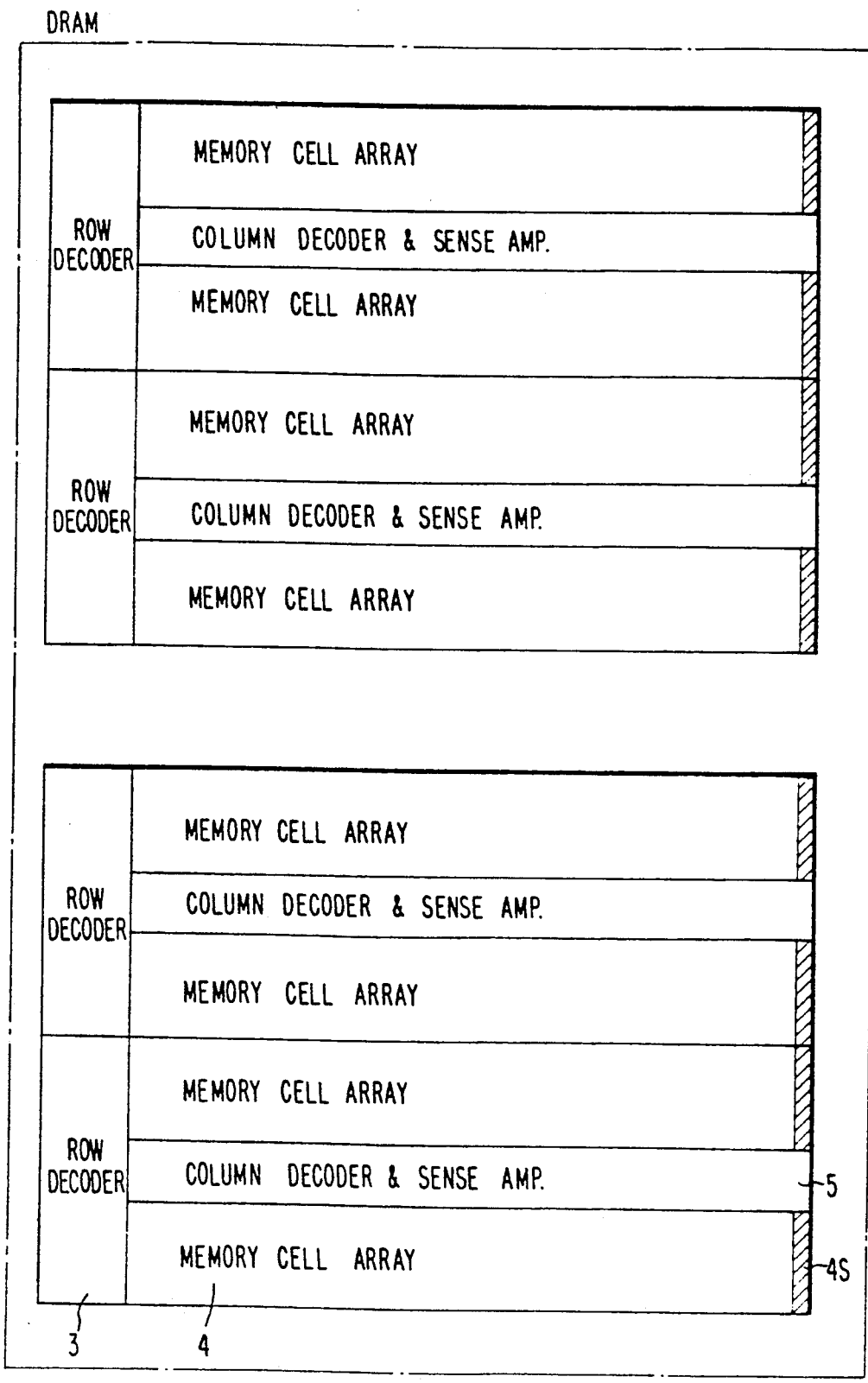
FIG. 1 is a block diagram of a conventional DRAM.
Figure 2A:
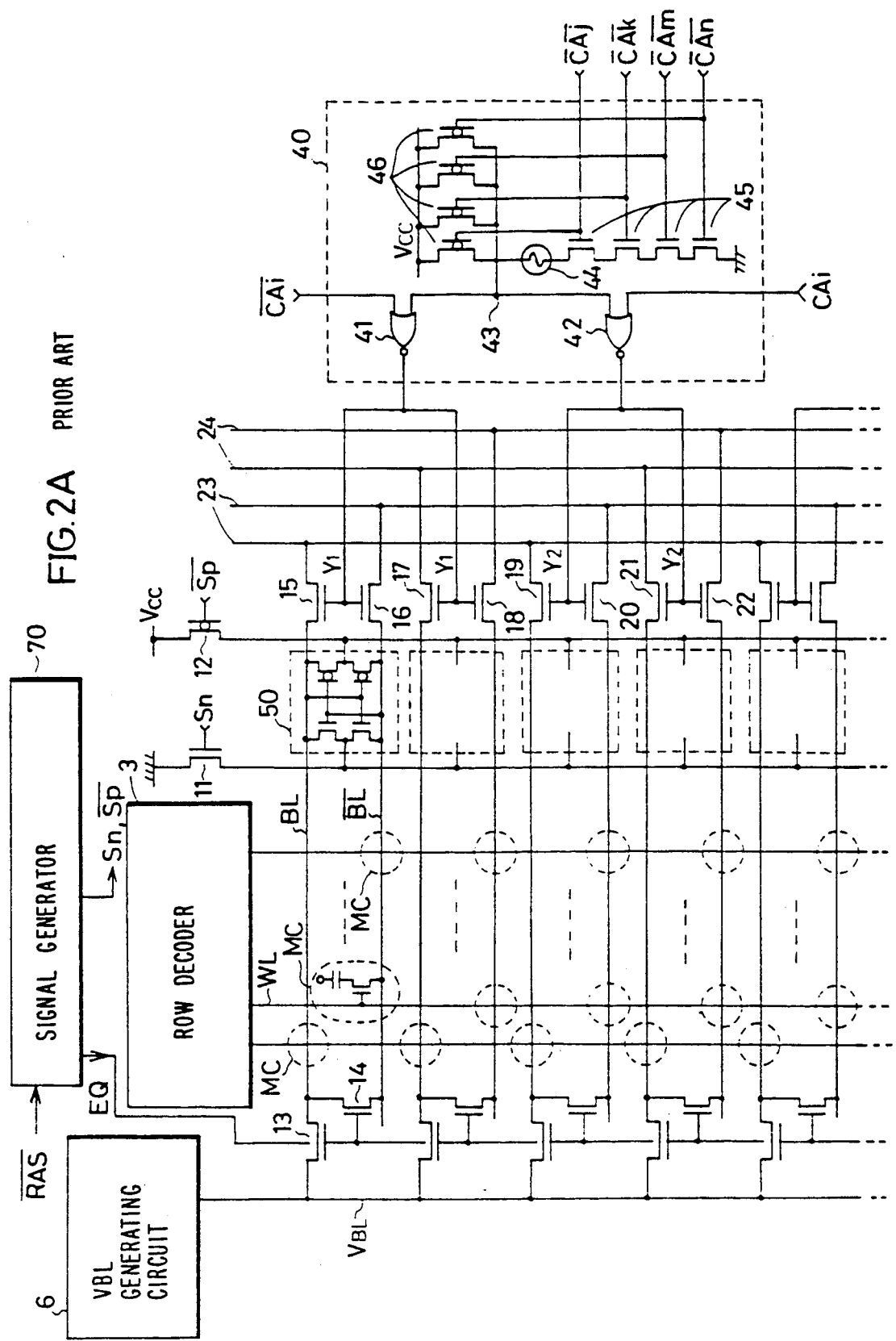
FIG. 2A is a circuit diagram of the memory cell array shown in FIG. 1.
Figure 9:
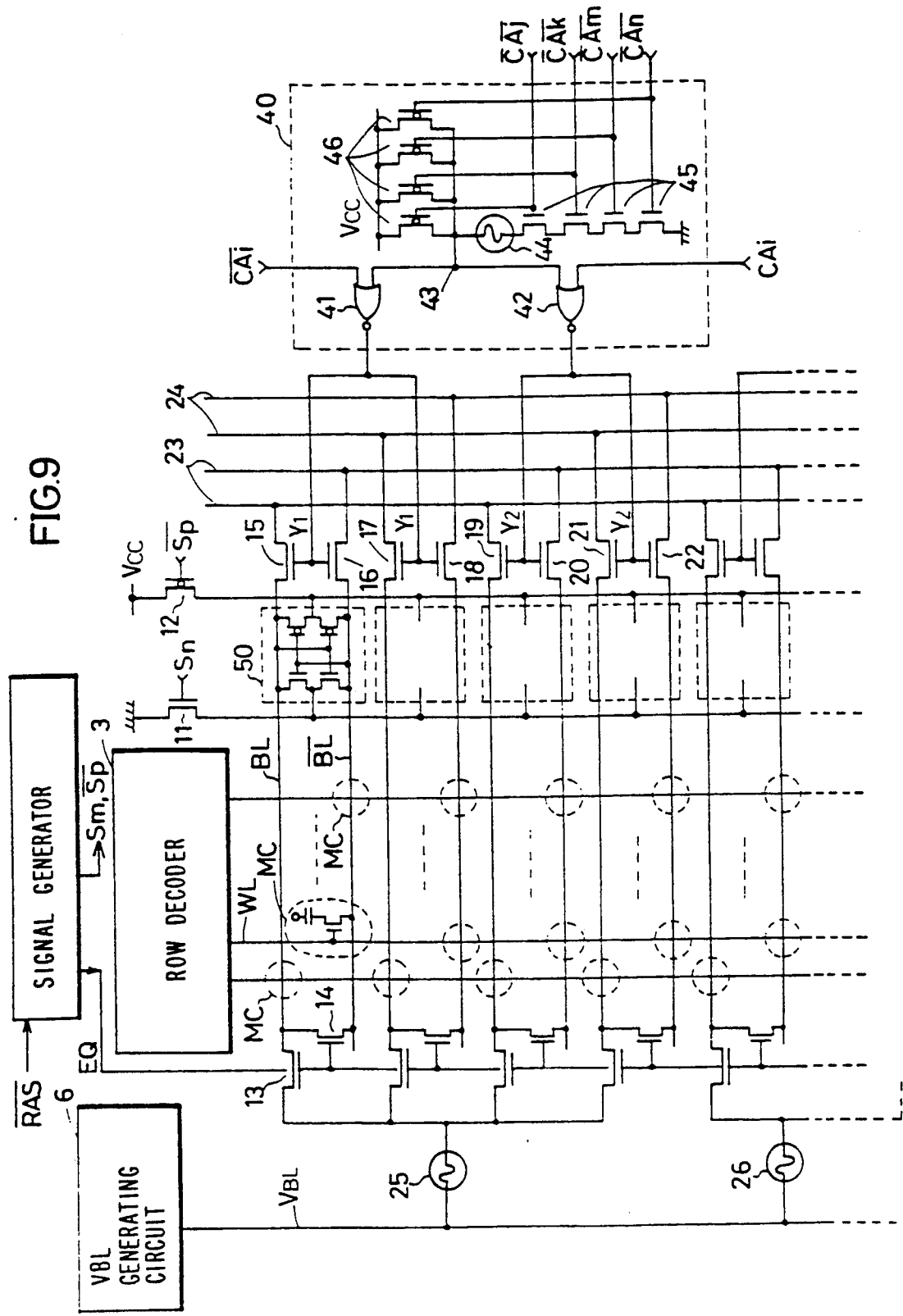
FIG. 9 is a circuit diagram of the DRAM showing one embodiment of the present invention.

Referring to FIG. 9, as compared with conventional DRAM shown in FIG. 2A, electric fuses 25 and 26 connected to every four-bit-lines are newly provided in the DRAM shown in FIG. 9. The precharging voltage $V_{BL}$ generated by the precharging voltage generating circuit 6 is provided to the respective four bit line pairs through the respective fuses 25 and 26.

Figure 3:
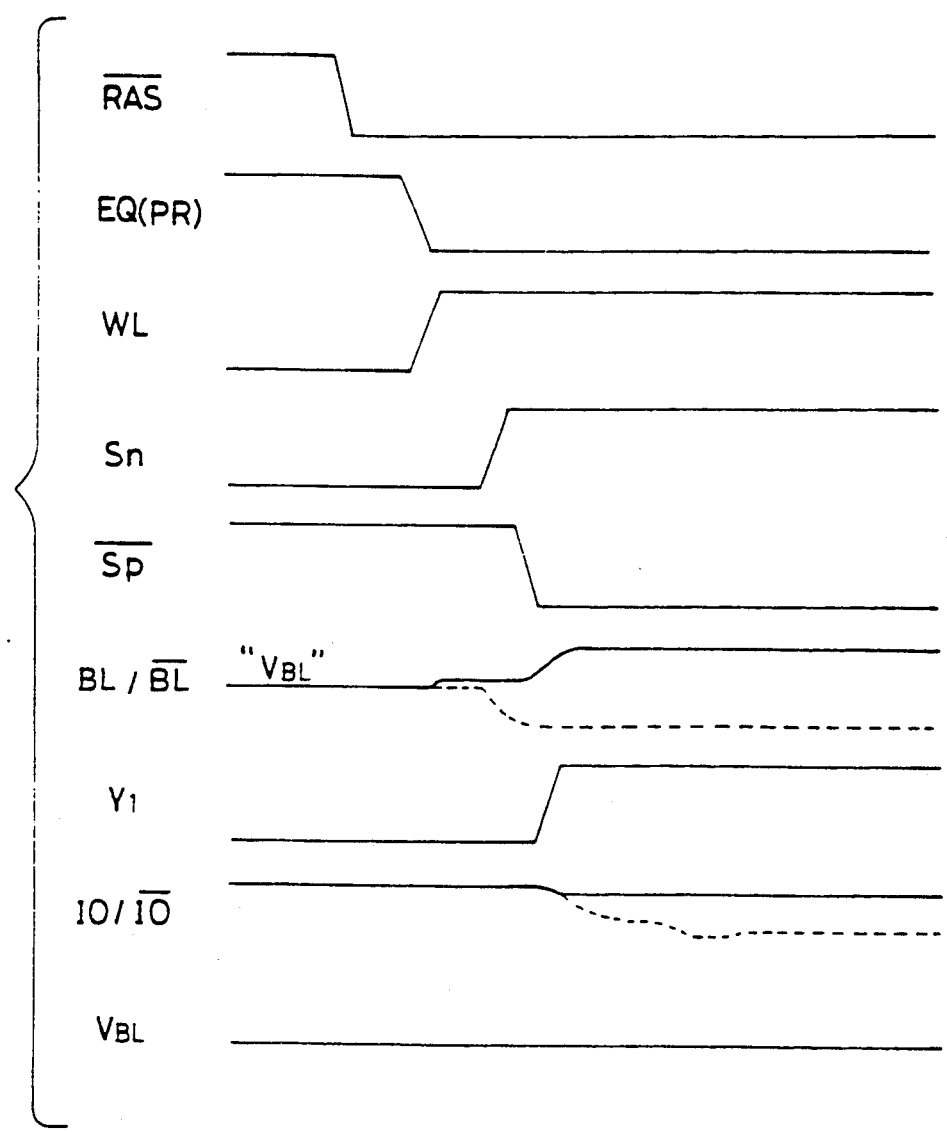
FIG. 3 is a timing chart for showing operation of the DRAM shown in FIG. 2.
Figure 4:
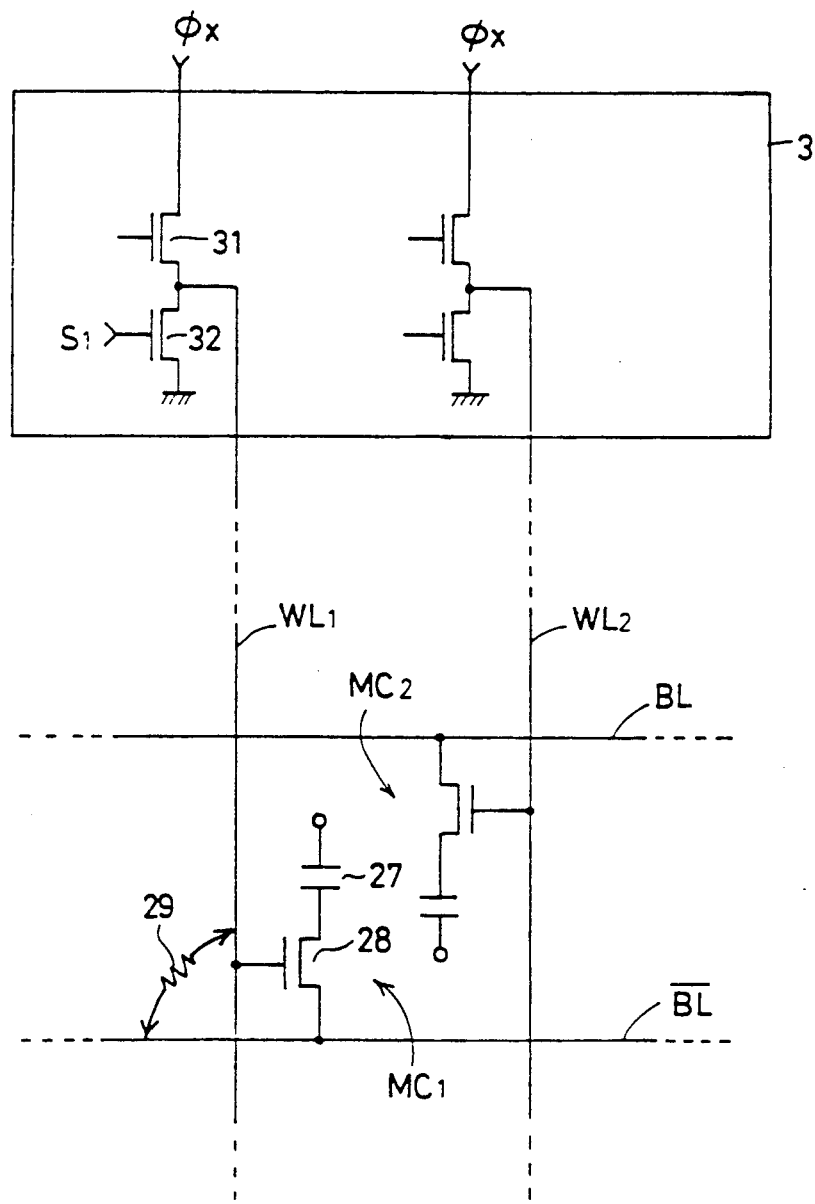
FIG. 4 is a circuit diagram showing occurrence of a defect in a memory cell.
Figure 5:
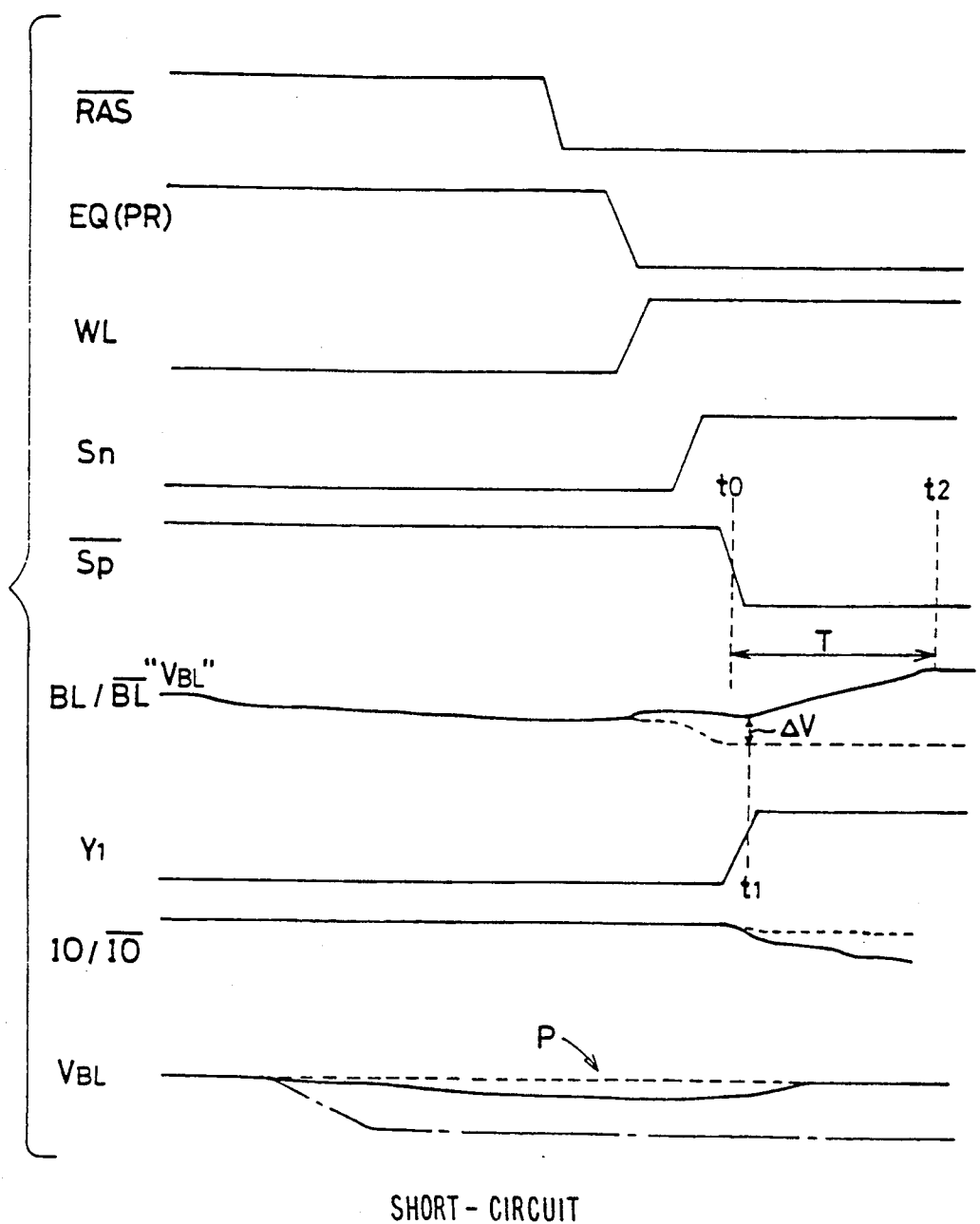
FIG. 5 is a timing chart showing an abnormal reading operation caused by a defect in a memory cell.
Figure 6:
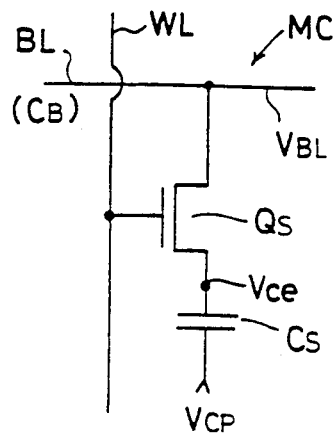
FIG. 6 is a circuit diagram of a memory cell of a DRAM.
Figure 8:
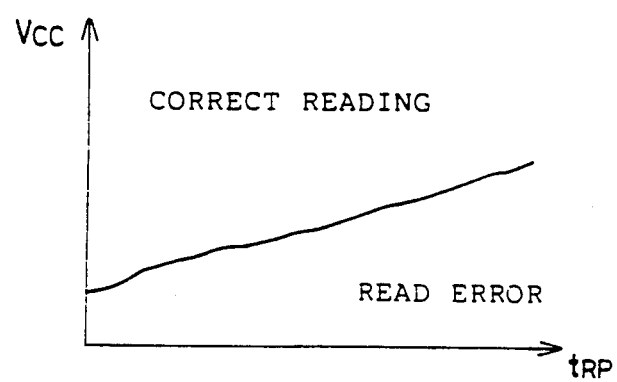
FIG. 8 is a graph showing relationship between the length of the off time period and reading errors.
Figure 7:
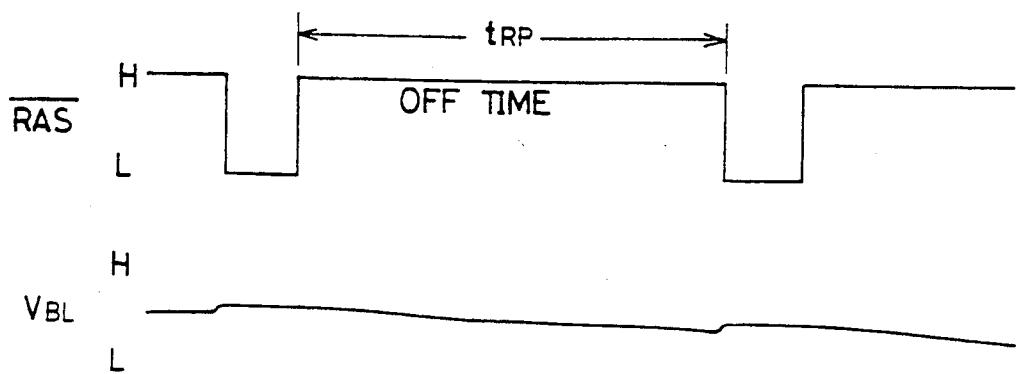
FIG. 7 is a timing chart showing relationship between the length of the off time period and a decrease of precharge voltage.

When at least one of the memory cells connected to the four bit line pairs selected by the column decoder 40 has a defect, the fuse 44 in the column decoder 40 is cut off. Accordingly, as the column decoder 40 provides high level signals Y1 and Y2, transistors 15 through 22 turn off. In addition, the fuse 25 is also cut off. As a result, the connection between the bit line to which a defective memory cell is connected and the precharging voltage generating circuit 6 is physically cut off. Therefore, even when a defect as shown in FIG. 4 occurs, or when a word line and a bit line are electrically connected by a certain foreign material, it does not cause a decrease in the precharging voltage $V_{BL}$. Thus, the decrease of the precharging voltage $V_{BL}$ shown by an arrow P in FIG. 5 is avoided and a normal reading operation shown in FIG. 3 is performed. Moreover, it is also noted that data is read in a shorter time period than the case shown in FIG. 5.

As shown in the embodiment of FIG. 9, the fuse 25 provided on the precharging voltage generating circuit 6 side is preferably provided corresponding to the number of the bit line pairs to which access is disabled by the fuse 44. This is because it is sufficient for avoiding a read error to physically separate the bit line pairs not accessed from the precharging voltage generating circuit 6. In addition, the respective fuses 25 and 44 are provided at equal intervals, or at intervals corresponding to four bit line pairs, so that excessive density of the fuse arrangement by adding the fuse 25 is partially avoided.

Figure 2B:
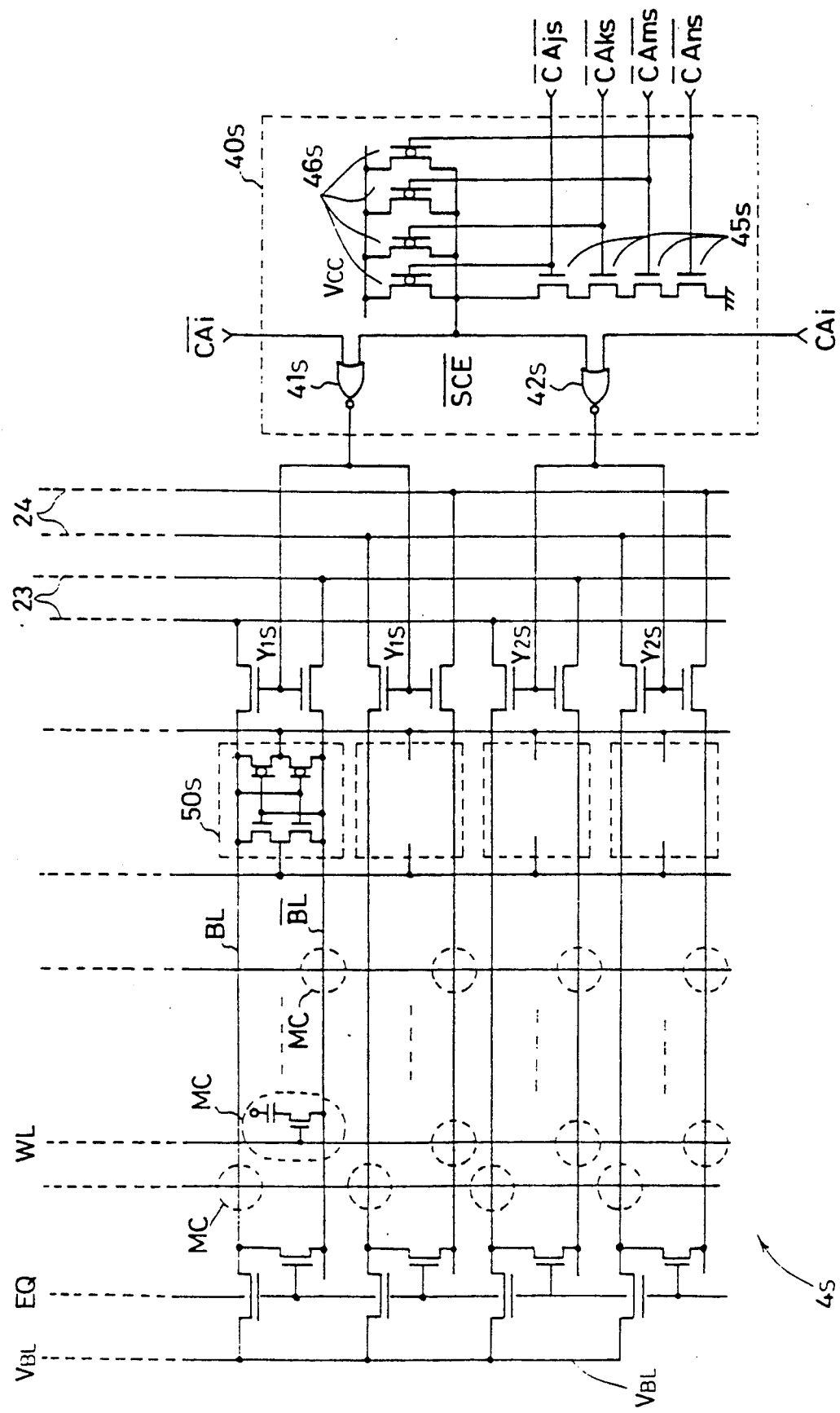
FIG. 2B is a circuit diagram of the spare memory cell column shown in FIG. 1.
Figure 2C:
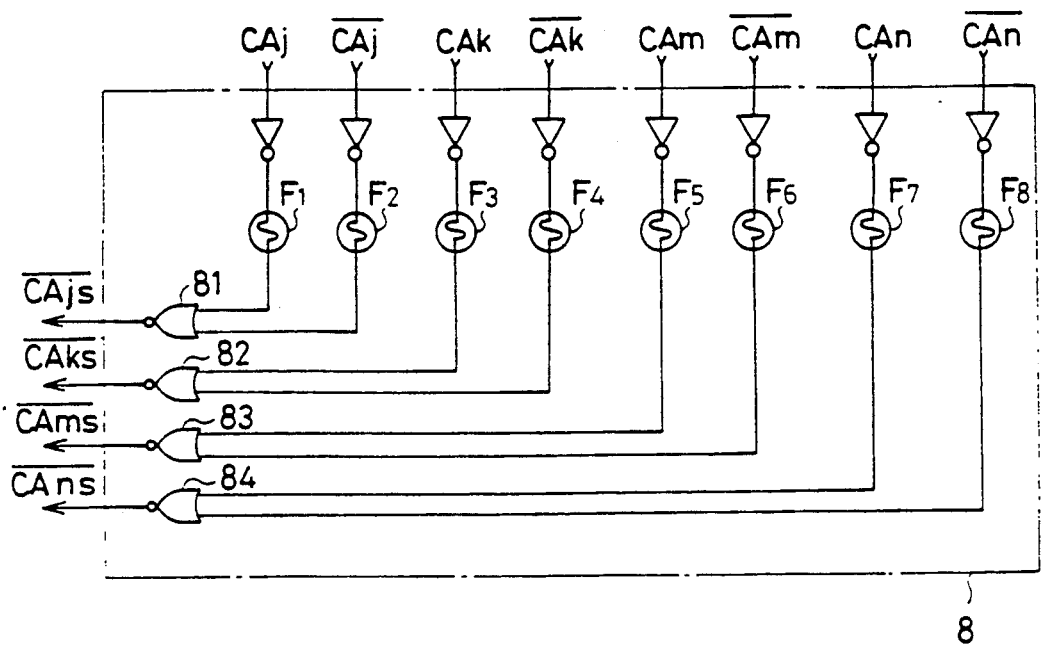
FIG. 2C is a circuit diagram of a program circuit for selecting a spare memory column.
Figure 2D:
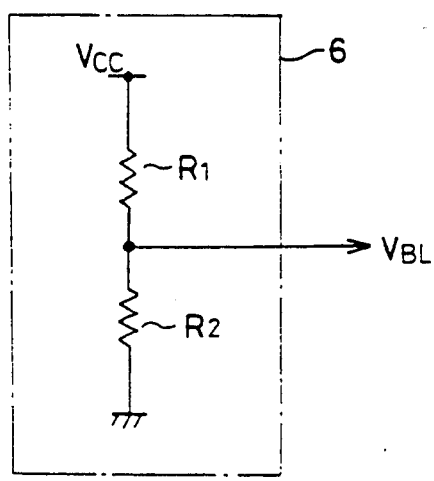
FIG. 2D is a circuit diagram of the precharge voltage ($V_{BL}$) generating circuit shown in FIG. 2A.
Figure 2E:
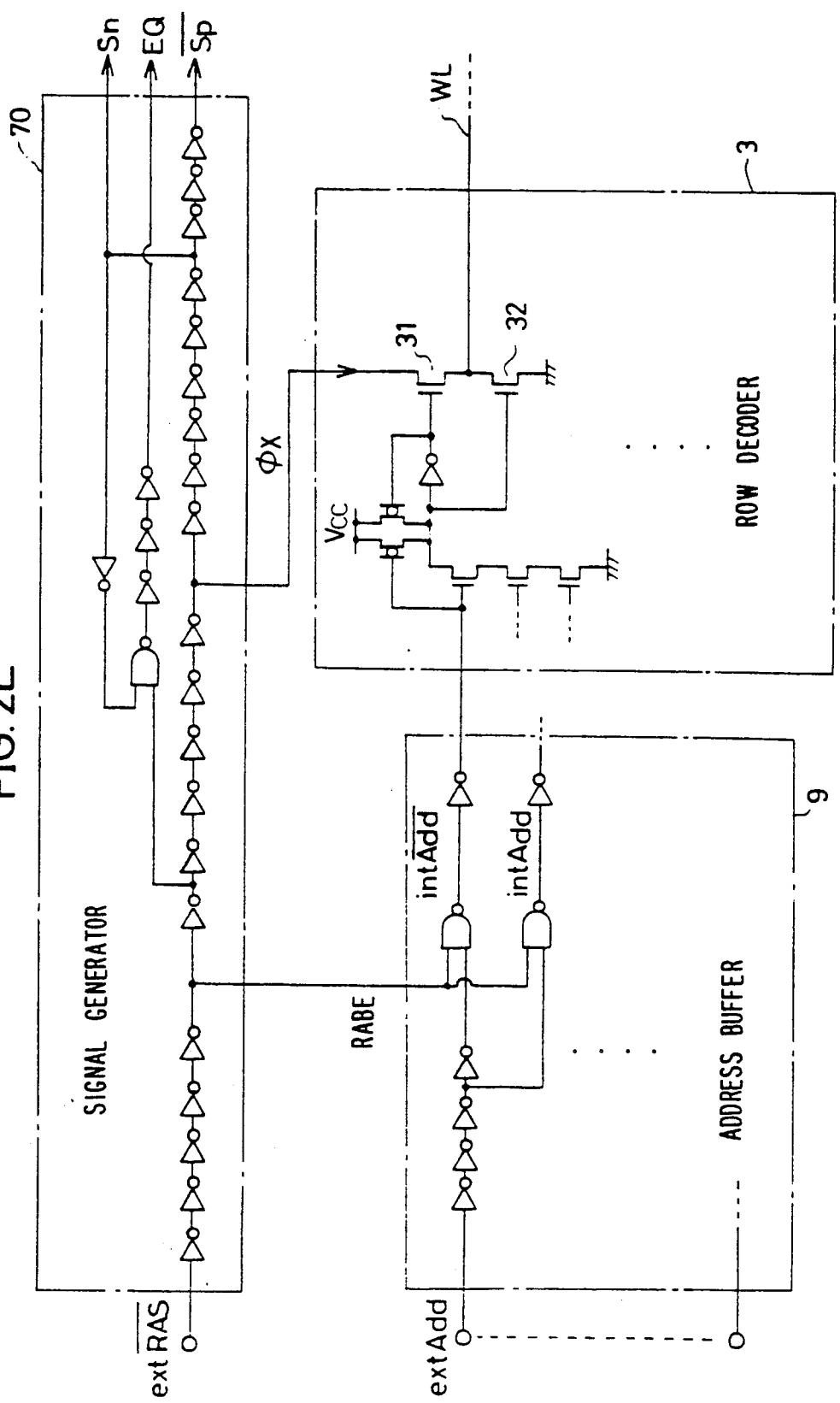
FIG. 2E is a circuit diagram of the row decoder and the signal generator shown in FIG. 2A, and an address buffer.

Referring to FIG. 10, the procedure for electrically replacing a defective memory cell column by a spare memory cell column in the DRAM shown in FIG. 9 will be described below. First, in step 91, a function test is performed for confirming functions of the DRAM. After writing predetermined test data into the DRAM, the stored data is read out. By comparing the written test data and the read data, existence and location of a defective memory cell are detected. Especially, a column in which a defective memory cell exists is detected (step 92). In step 93, a fuse 44 in a column decoder for the defective column, or the column decoder 40 shown in FIG. 9 is blown (cut). The defective memory cell column is not selected by column decoder 40 thereafter. In step 94, a fuse 25 connected to a defective column is blown. Thus, the $V_{BL}$ generating circuit 6 is electrically isolated from the defective memory cell column. Finally, in step 95, fuses F1 through F8 in program circuit 8 shown in FIG. 2C are selectively blown so that a spare memory cell column shown in FIG. 2B is selected. Thus, when a column address signal specifying a defective memory cell column is supplied, a spare memory cell column is selected. Among steps shown in FIG. 10, the order of steps 93, 94 and 95 for blowing fuses is optional.

In the above description, a case where a word line and a bit line are electrically connected by a foreign material has been described. In addition, the present invention can be applied to a case where a bit line and ground or a bit line and a power supply (Vcc) are connected by a foreign material. That is to say, by providing the fuses 25 and 26 as shown in FIG. 9, a read error also can be prevented from occurring in these cases.

Moreover, the precharging voltage $V_{BL}$ is prevented from decreasing, so that the voltage difference in the bit line pair BL and $\overline{BL}$ can be amplified by the sense amplifier 50 shown in FIG. 9 in a short time. That is, a bit line rises in a short time, so that the voltage between the bit lines BL and $\overline{BL}$ amplified by the sense amplifier 50 is assured to be at a given level when the column decoder 40 generates a high level signal Y1. As a result, a data signal stored in a memory cell is correctly read out.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory device comprising:
    a memory cell array having a plurality of memory cells arranged in row and column directions, each memory cell being of a one transistor-one capacitor type,
    a plurality of spare memory cell columns, each spare memory cell column having a redundant circuit function for electrically replacing a defective memory cell column in said memory cell array with the spare memory cell column,
    a plurality of bit lines connected to said plurality of memory cells, respectively,
    means for generating a precharging voltage;
    means for precharging said plurality of bit lines to said precharging voltage, and
    cutting-off means connected between said precharging voltage generating means and said precharging means for selectively cutting off a connection between said precharging voltage generating means and said bit lines connected to said defective memory cell column so as to prevent said defective memory cell column from changing said precharging voltage on said plurality of bit lines of said dynamic random access memory device.

2. The dynamic random access memory device according to claim 1, wherein
    said cutting-off means comprises fuse means connected between said precharging voltage generating means and said precharging means, and
    said fuse means being selectively caused to cut off the connection between said precharging voltage generating means and said precharging means due to the presence of said defective memory cell column.

3. The semiconductor memory device according to claim 2, wherein said precharging means includes:
    means for generating an equalizing signal,
    means for equalizing said plurality of bit lines, and
    means for supplying said precharging voltage to said equalizing means connected between said fuse means and said equalizing means in response to the equalizing signal.

4. The semiconductor memory device according to claim 1, wherein said plurality of bit lines comprises a plurality of bit line pairs.

5. The semiconductor memory device according to claim 1, wherein said defective memory cell column has a tendency to vary the precharging voltage generated by said precharging voltage generating means when the connection between said precharging voltage generating means and said plurality of bit lines is not selectively cut off by said cutting-off means.

6. The semiconductor memory device according to claim 4, wherein
    said cutting-off means comprises fuse means connected between said precharging voltage generating means and said precharging means, and
    said fuse means being selectively caused to cut off the connection between said precharging voltage generating means and said precharging means due to the presence of said defective cell.

7. The semiconductor memory device according to claim 6, wherein said precharging means includes:
    means for generating an equalizing signal,
    means for equalizing said plurality of bit lines, and
    means for supplying said precharging voltage to said equalizing means connected between said fuse means and said equalizing means in response to the equalizing signal.

8. A dynamic random access memory device comprising:
    a plurality of row lines and bit lines crossing each other on a semiconductor substrate;
    a spare memory cell column;
    redundant circuit means for electrically replacing a defective cell column in a memory cell array with the spare memory cell column;
    memory cells arranged in row and column directions in said memory cell array with the spare memory cell column, each memory cell being of a one transistor-one capacitor type, and said plurality of row lines and bit lines connected to said memory cells, respectively;
    means for generating a precharge voltage;
    means for precharging said plurality of bit lines to said precharging voltage; and electrical isolation means connected between said precharging voltage generating means and said precharging means for selectively isolating said precharging voltage generating means from said plurality of bit lines to prevent said defective cell column from varying said precharge voltage on said plurality of bit lines of said dynamic random access memory device.

* * * * *